(12) United States Patent
Kim et al.

(10) Patent No.: US 7,364,784 B2
(45) Date of Patent: Apr. 29, 2008

(54) THIN SEMICONDUCTOR PACKAGE HAVING STACKABLE LEAD FRAME AND METHOD OF MANUFACTURING THE SAME

(75) Inventors: Jin-Ho Kim, Cheonan-si (KR); Sung-Hwan Yoon, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 349 days.

(21) Appl. No.: 10/834,187

(22) Filed: Apr. 29, 2004

(65) Prior Publication Data

US 2005/0054141 A1   Mar. 10, 2005

(30) Foreign Application Priority Data

Aug. 23, 2003   (KR) .................. 10-2003-0058508

(51) Int. Cl.
 *H01L 23/495* (2006.01)
 *H01L 21/784* (2006.01)

(52) U.S. Cl. .............. 428/123; 438/106; 438/112; 257/23.004; 257/23.043; 257/23.05

(58) Field of Classification Search ............ 438/106, 438/111, 112, 123; 257/E23.004, E23.043–9, 257/E23.05
See application file for complete search history.

(56) References Cited

U.S. PATENT DOCUMENTS 5,428,248 A    6/1995   Cha 5,454,905 A  * 10/1995   Fogelson ................ 29/827
6,337,510 B1 *  1/2002   Chun-Jen et al. ........ 257/666
6,878,570 B2 *  4/2005   Lyu et al. ............... 438/106

FOREIGN PATENT DOCUMENTS

JP    10-200039       7/1998
KR  2001-0064914      7/2001

OTHER PUBLICATIONS

Korean Office Action dated Oct. 31, 2005 for KR Application No. 10-2003-0058508 and translation.

* cited by examiner

*Primary Examiner*—Zandra V. Smith
*Assistant Examiner*—Pamela E Perkins
(74) *Attorney, Agent, or Firm*—Harness, Dickey & Pierce, P.L.C.

(57) ABSTRACT

Provided is a thin semiconductor package comprising a semiconductor chip and a lead frame, the lead frame including a paddle portion configured for mounting the semiconductor chip in a manner that exposes bonding pads within an aperture formed in a center portion of the lead frame and a peripheral terminal pad portion for establishing external contacts. A plurality of bonding wires are used to establish electrical connection between a lower surface of the paddle part and corresponding bonding pads with intermediate leads providing connection to the terminal pad portions. The semiconductor chip, lead frame and bonding wires may then be encapsulated to form a thin semiconductor package having a thickness substantially equal to that of the terminal pad portions. The thin semiconductor packages may, in turn, be used to form multi-chip stack packages using known good semiconductor chips to form a high-density compound semiconductor packages.

15 Claims, 5 Drawing Sheets

THIN SEMICONDUCTOR PACKAGE HAVING STACKABLE LEAD FRAME AND METHOD OF MANUFACTURING THE SAME

CROSS-REFERENCE TO RELATED APPLICATIONS

This application claims the priority of Korean Patent Application No. 03-58508 filed on 23 Aug. 2003 in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the same and, more particularly, to a thin semiconductor package having a stackable lead frame and a method of manufacturing such packages.

2. Description of the Related Art

In conventional semiconductor production, after forming a plurality of semiconductor chips on a wafer using one of many semiconductor fabrication processes, the completed wafer is thinned by removing backside material and sawn along scribe lines provided between adjacent semiconductor chips to separate the individual semiconductor chips. One or more of the individual semiconductor chips are then assembled in a semiconductor package that can, in turn, be mounted on a mounting substrate or other electronic device such as a printed circuit board (PCB). However, due to the continuing development and miniaturization of electronic devices in recent years, there is a corresponding interest in semiconductor packages that can provide improved performance and/or allow for higher packaging densities.

FIG. 1 is a cross-sectional view illustrating a conventional thin semiconductor package. The conventional thin semiconductor package has a stack of two semiconductor chips 10, both of which are connected to a lead frame 14 using gold bumps 12. The lead frame 14 includes both an inner lead 14a and an outer lead 14b, with the semiconductor chip 10, the inner lead 14a and a portion of the outer lead 14b molded with an encapsulant 16 to protect the semiconductor chip 10 from external impact, moisture and contaminants.

The conventional structure of the thin semiconductor package illustrated in FIG. 1 has certain drawbacks including a tendency for the outer lead 14b to deform as a result of the long length of the lead frame 14 and difficultly in positioning the outer leads 14b in the same plane. That is, when using conventional thin semiconductor package, it is difficult to position and maintain the outer leads 14b in a coplanar orientation.

SUMMARY OF THE INVENTION

The exemplary embodiments of the present invention provide a lead frame, a thin semiconductor package incorporating such a lead frame, and a method for manufacturing such lead frames and semiconductor packages whereby the outer leads have an increased resistance to deformation and may be more easily arranged in a coplanar orientation.

Exemplary embodiments of the present invention include a semiconductor package including a lead frame including a paddle region on which a semiconductor chip is mounted face-down over an aperture formed in a center portion of the lead frame; a plurality of wires electrically connecting a lower surface of leads formed in the paddle region to bonding pads on the surface of the semiconductor chip; a terminal region that connects to an external terminal, the terminal region having an upper surface that is positioned higher than an upper surface of the paddle part, and a lower surface that is positioned lower than a lower surface of the paddle part; an intermediate lead that connects the paddle part and the terminal regions; and an encapsulant, in which the semiconductor chip and the wires are molded to protect the semiconductor chip and the wires from damage.

The terminal region may include a full-thickness portion of the lead frame part that forms an edge of the lead frame and a protrusion portion formed from a thinned portion of the lead frame that protrudes inwardly from the edge portion. The protrusion portion of the terminal region may, in turn, be connected to intermediate leads formed from the thinned portion of the lead frame between the paddle region and the terminal region.

The upper and lower surfaces of the encapsulant may be substantially coplanar with respective upper and lower surfaces of the terminal pad part to form semiconductor device packages that can be stacked vertically, typically with solder joints arranged between adjacent packages to form physical and electrical connections, to form high-density multi-chip semiconductor packages.

The lead frame may be manufactured from a uniform lead frame blank to produce a first intermediate lead frame structure generally corresponding to a channel, bowl or U-shaped structure; forming the paddle part from a mounting region of the first intermediate lead frame structure by positioning the central portion of the mounting region between planes defined by the upper and lower surfaces of the terminal region to form a second intermediate structure. Portions of the second intermediate lead frame structure may then be removed to define electrically isolated paddle regions, intermediate leads and terminal regions on which a semiconductor chip may be mounted and wire bonded. Once the wire bonding operation has been completed, the paddle region, intermediate leads, bonding wires and semiconductor chip may be encapsulated with a resin composition to protect the semiconductor chip and the wires from damage.

By constructing a lead frame from a uniform lead frame blank According to the present invention, since a part of the lead frame is used as the terminal pad part, there is no outer lead deformation problem, and outer leads can be easily positioned in the same plane. Also, pre-performance tested thin semiconductor packages can be stacked and connected by solder balls formed on the terminal pad parts, to form a high-density compound semiconductor package.

BRIEF DESCRIPTION OF THE DRAWINGS

The features and advantages of the present invention are described with reference to exemplary embodiments in association with the attached drawings in which similar reference numerals are used to indicate like or corresponding elements and in which.

Figure 1:
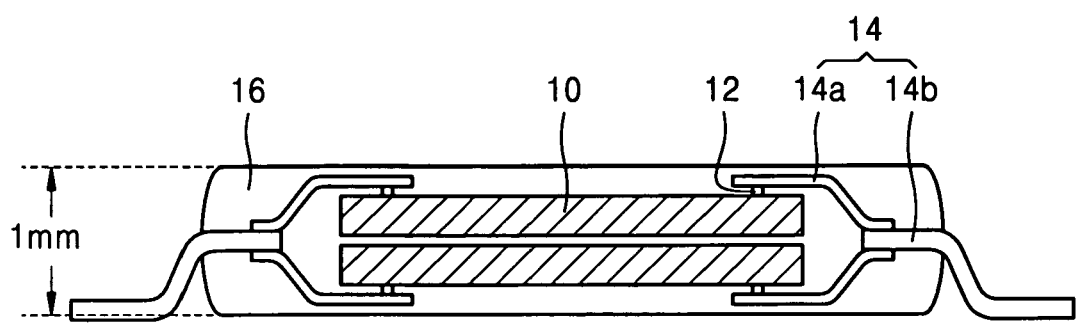
FIG. 1 is a cross-sectional view of a conventional thin semiconductor package.

These drawings have been provided to assist in the understanding of the exemplary embodiments of the invention as described in more detail below and should not be construed as unduly limiting the invention. In particular, the relative spacing, sizing and dimensions of the various elements illustrated in the drawings are not drawn to scale and may have been exaggerated, reduced or otherwise modified for the purpose of improved clarity.

DETAILED DESCRIPTION OF EXEMPLARY EMBODIMENTS

Hereinafter, exemplary embodiments of the present invention will be described more fully with reference to the accompanying drawings. As will be appreciated by those of skill in the art, however, this invention may be embodied in many different forms and should not be construed as being limited solely to the embodiments set forth herein. Certain embodiments are described herein so that this disclosure is thorough, complete, and fully conveys the concept of the invention to those skilled in the art.

Figure 2:
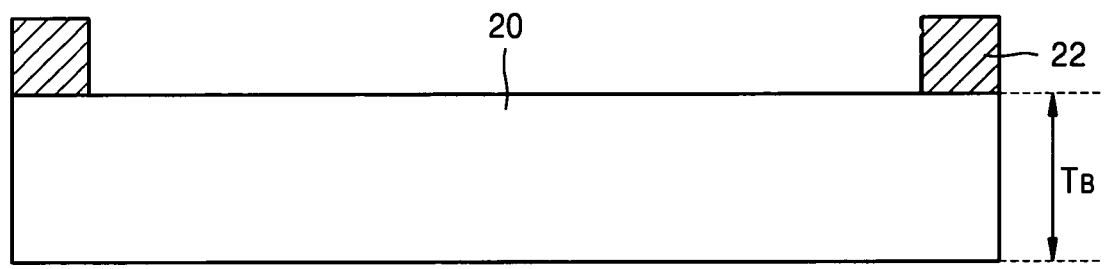
FIGS. 2-7 are cross-sectional views illustrating a thin semiconductor package and certain steps in the process of manufacturing a semiconductor package according to an exemplary embodiment of the present invention.

FIGS. 2 through 7 are cross-sectional views illustrating a thin semiconductor package and a method for manufacturing such a semiconductor package according to exemplary embodiments of the present invention;

As illustrated in FIG. 2, a lead frame 20 having a predetermined thickness TB is prepared. The lead frame 20 should be thick enough to form a terminal pad for connecting to an external terminal, and a paddle part where a semiconductor chip will be mounted. For example, 200 μm is an appropriate thickness for the lead frame 20. The lead frame 20 can be formed from conductive metal, typically an alloy such as a copper (Cu) based alloy or an iron-nickel (Fe—Ni) based alloy. If the lead frame 20 is formed from a Fe—Ni alloy, a suitable alloy composition may include about 42 wt % Ni and about 58 wt % Fe. A photoresist pattern 22 may then be formed on the lead frame 20 to expose a central region on the lead frame 20.

Figure 3:
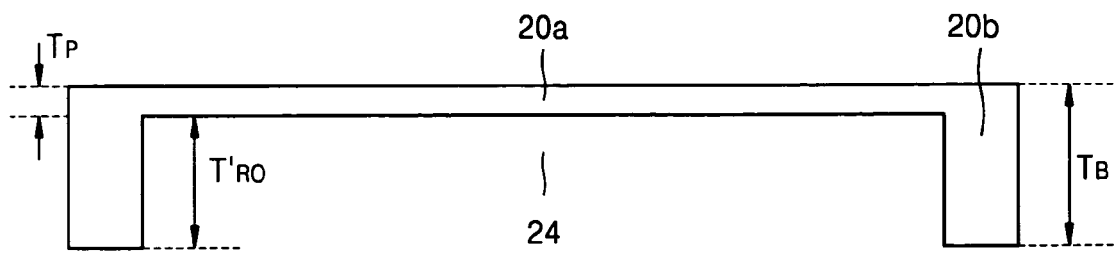

As illustrated in FIG. 3, a portion of the exposed central region of the lead frame 20 is removed using a suitable etch process to form a recess 24 in the lead frame using photoresist pattern 22 as an etch mask. As illustrated in FIG. 3, more than one half of the thickness of the lead frame 20 may be removed during the etch process, in this instance about 150 μm, to form a recess 24 having a predetermined depth and, correspondingly, leave a suitable thickness of the lead frame 20 for subsequent processing.

After the etch process has been completed, the photoresist pattern 22 may be removed, leaving the lead frame 20 with a thinned central region 20a and thicker edge or peripheral regions 20b that, in cross-section, have a generally trough-shaped or U-shaped configuration. The thinned central region 20a of the lead frame 20 will be used to form a paddle part on which the semiconductor chip may be mounted and the edge or peripheral regions 20b will be used to form terminal pads.

Figure 4:
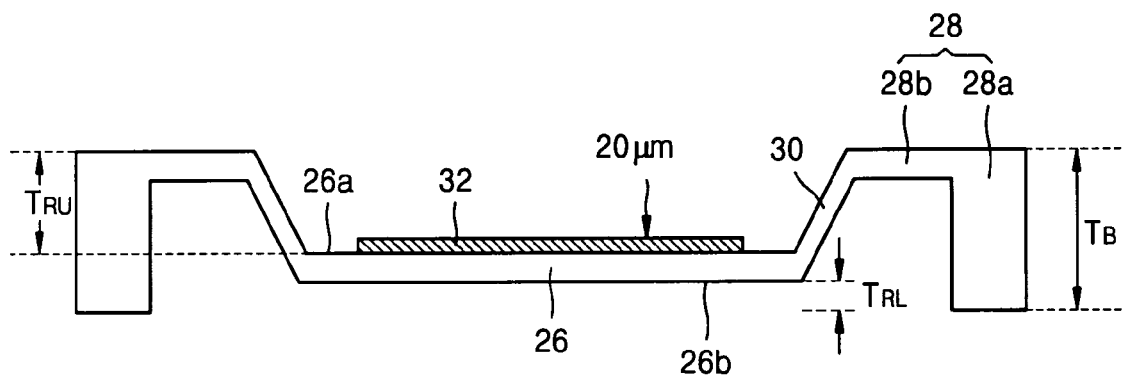

As illustrated in FIG. 4, a portion of the lead frame in the thinned central region 20a of the lead frame 20 may be pressed back into the recess to form paddle part 26 on which a semiconductor chip may be mounted and intermediate leads 30 having a thickness $T_I$ that connect the paddle part 26 to the terminal pad parts 28. An edge portion of the thinned central region 20a that is not pressed back into the recess 24 may be used to form an inner protrusion portion 28b of terminal pad parts 28 with the outer portion 28a of the terminal parts being formed from the full thickness edge portions 20b of the lead frame 20, and inclined intermediate leads 30 formed between the terminal pad parts 28 and the paddle part 26. The completed terminal pad parts 28 include both a plain portion 28a that defines the periphery of lead frame 20 and a protrusion portion 28b that protrudes inwardly from the plain portion 28a. The protrusion portions 28b provide electrical connection between the plain portions 28a of the terminal pads and the corresponding intermediate leads 30.

As illustrated in FIG. 4, the upper surface 26a of the paddle part 26 may be recessed relative to the upper surfaces of the terminal pad parts 28 by a first distance $T_{RU}$ equal to more than one half the depth of the original recess 24. Preferably, the lower surface 26b of the paddle pad 26 will, in turn, also be recessed relative to the lower surfaces of the terminal pad parts 28 by a second distance $T_{RL}$, the second distance typically being smaller than the first distance. For example, the upper surface 26a of the paddle part 26 may be recessed about 100 μm relative to the upper surfaces of the terminal pad parts 28 while the lower surface 26b of the paddle part may be recessed about 50 μm relative to the lower surfaces of the terminal pad parts 28.

Next, as illustrated in FIG. 4, a layer of one or more adhesive agents 32 may be applied to a bonding region on the upper surface 26a of the paddle part 26 to allow a semiconductor chip to be attached to the paddle part. The thickness of the adhesive may be approximately 20' μm. An alternative to applying adhesive to the paddle part 26 is to provide adhesive regions on the active surface of the semiconductor chip with the adhesive regions contacting the paddle part 26 as the semiconductor chip is mounted on the lead frame. The adhesive(s) may be applied as a liquid using a variety of conventional materials and processes or may be applied as a solid such as adhesive tape.

Figure 5:
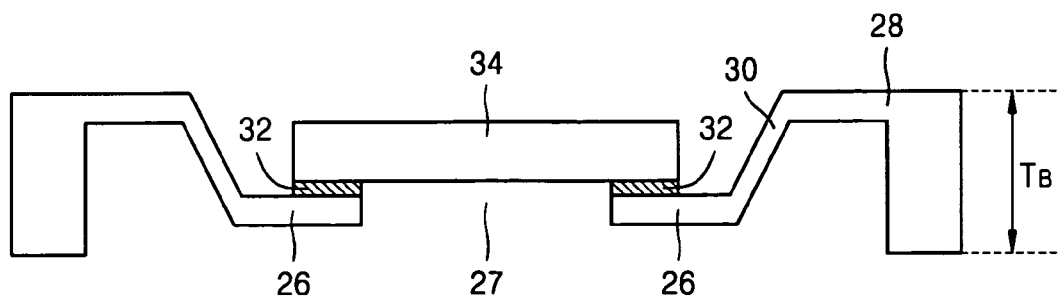

As illustrated in FIG. 5, an aperture 27 may then be formed in the paddle part 26 and adhesive layer 32 of the lead frame 20. A semiconductor chip 34 is mounted to the lead frame 20 with the active surface, i.e., the surface on which bonding pads (not shown) are provided, being exposed through the aperture 27. A typical semiconductor chip may have a thickness of approximately 80 μm.

Figure 6:
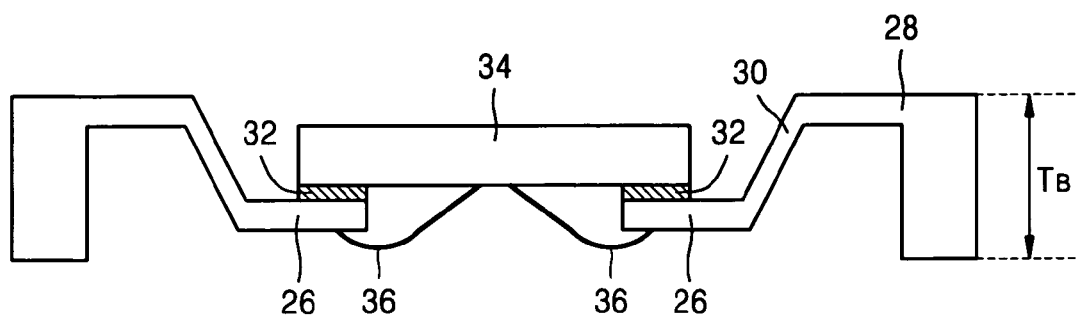

As illustrated in FIG. 6, the bonding pads (not shown) of the semiconductor chip 34 may then be connected to corresponding regions on the lower surface 26b of the paddle part 26 using bonding wires 36. Consequently, the lead frame 20 comprises the paddle part 26, the intermediate leads 30, and the terminal pad parts 28. The portions of the paddle part 26 and the intermediate leads 30 serve as inner leads while the terminal pad parts 28 serve as outer leads. As illustrated in FIG. 6, by utilizing the plain terminal pad parts 28a to serve as the outer leads, the likelihood of deformation of the outer leads can be reduced and the outer leads can be more easily positioned in a substantially planar orientation.

Figure 7:
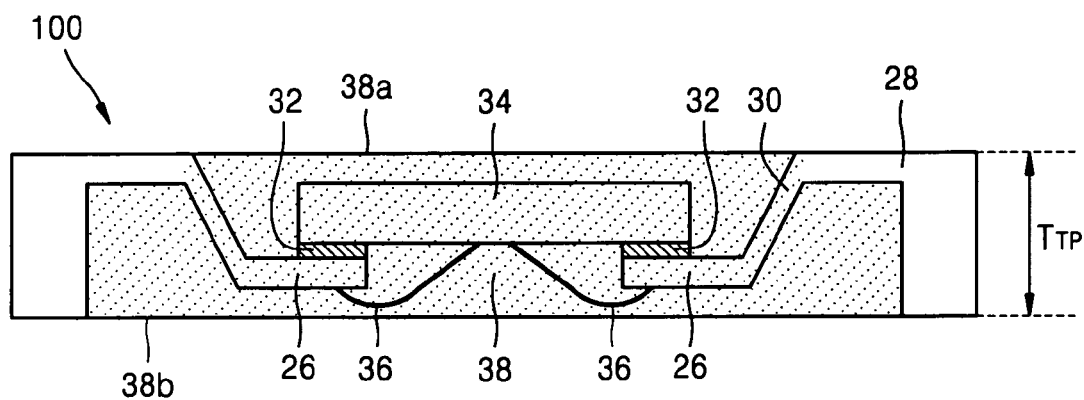

As illustrated in FIG. 7, the semiconductor chip 34 and the wires 36 are molded with an encapsulant 38, e.g., a resin or blend of resins, to encapsulate and protect the semiconductor chip 34, the bonding wires 36, and the inner leads. Upper 38a and lower surfaces 38b of the encapsulant 38 may be substantially coplanar with the upper and lower surfaces of the terminal pad part 28. A completed semiconductor package 100 manufactured according to an exemplary embodiment of the present invention will, therefore, have a package thickness $T_{TP}$ substantially the same as the original lead frame thickness, for example, approximately 200 μm thick.

Figure 8:
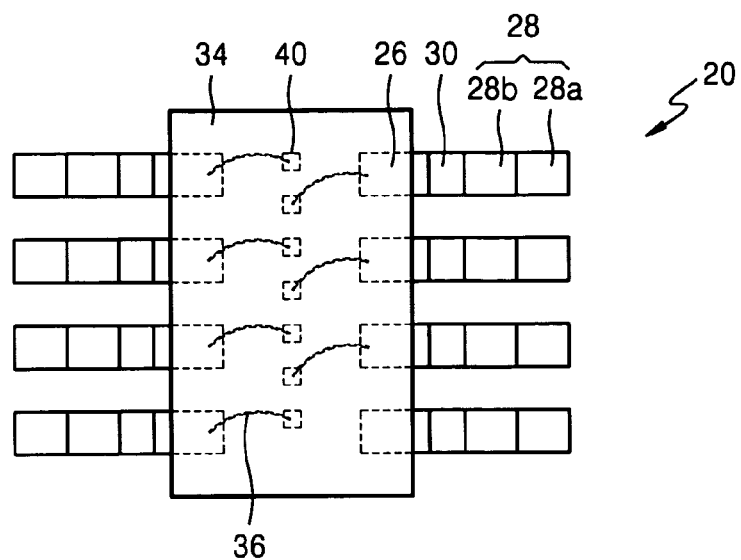
FIG. 8 is a partially plan view of a thin semiconductor package according to an exemplary embodiment of the present invention.

FIG. 8 is a partial plan view of a thin semiconductor package prepared according to an exemplary embodiment of the present invention. As illustrated in FIG. 8, the lead frame 20 supports a semiconductor chip 34 which is mounted face-down on the paddle parts 26. Bonding pads 40 are arranged in a central portion of the lower surface of the semiconductor chip 34 with the bonding pads 40 being connected to the corresponding paddle parts 26 by the bonding wires 36. The paddle parts 26 are, in turn, connected to the terminal pad parts 28 via the intermediate leads 30. The terminal pad parts 28 comprise the plain portions 28a that form the edges of the lead frame 20 and the protrusion portions 28b formed from the thinned central region 20a extending inwardly from the plain portions 28a toward the semiconductor chip.

Figure 9:
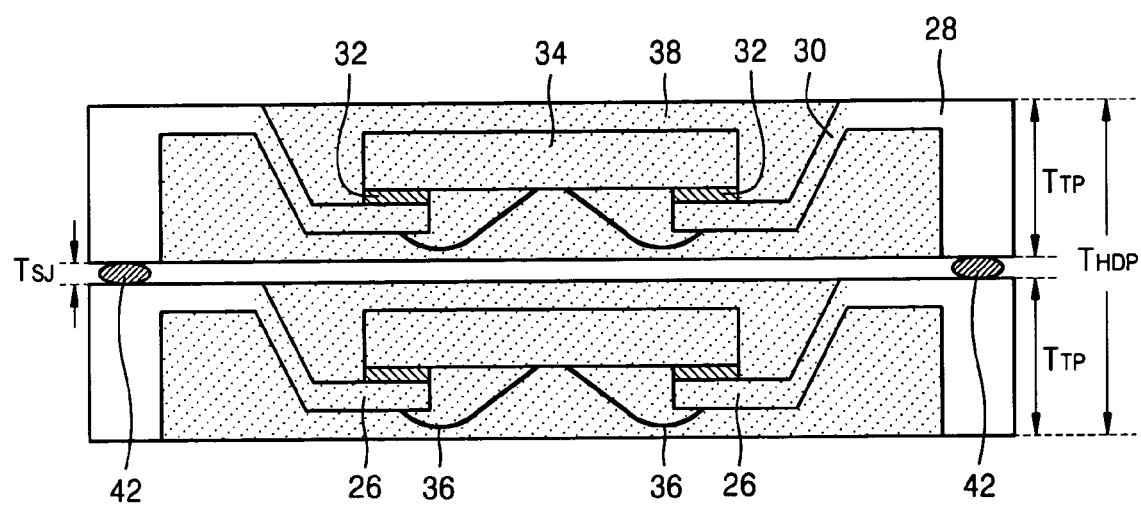
FIG. 9 is a cross-sectional view of two semiconductor packages according to an exemplary embodiment of the present invention stacked on top of each other.
Figure 10:
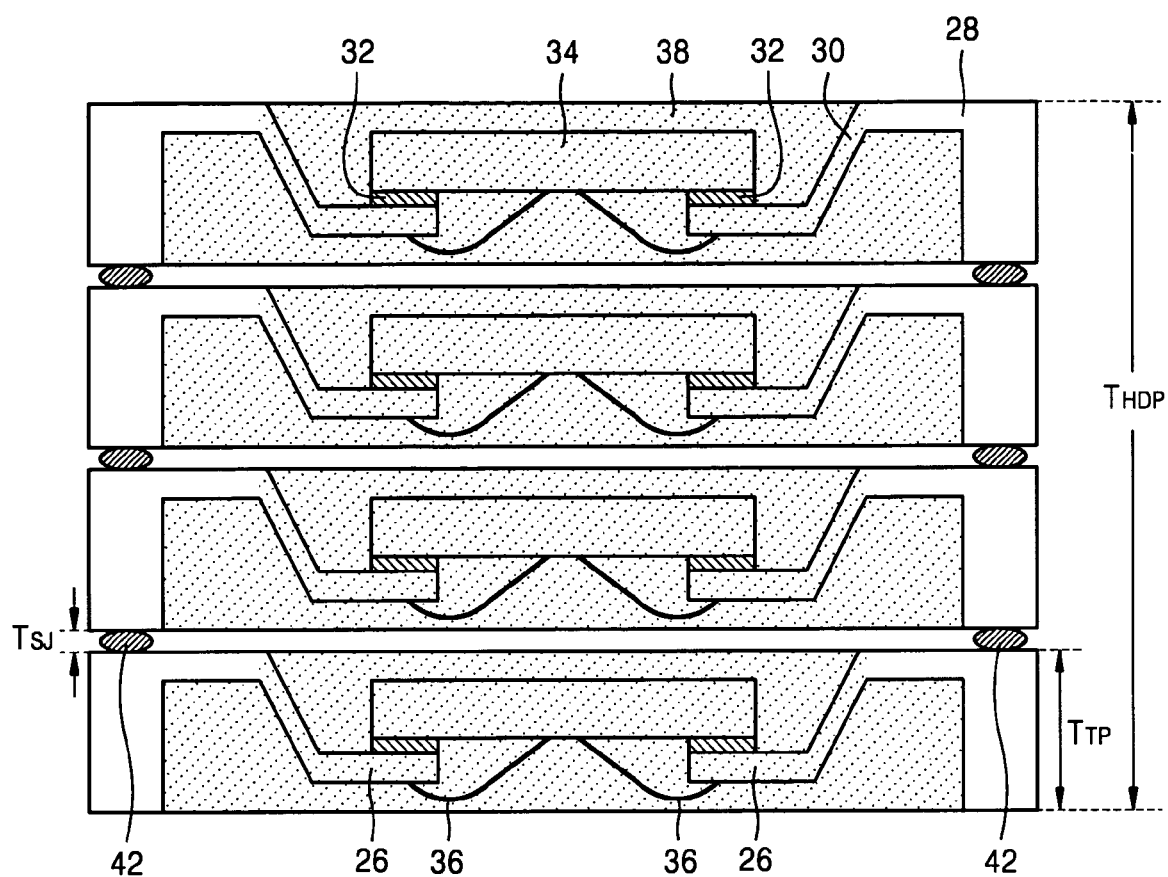
FIG. 10 is a cross-sectional view illustrating four thin semiconductor packages according to an exemplary embodiment of the present invention stacked on top of each other.

FIGS. 9 and 10 are cross-sectional views of multiple thin semiconductor packages prepared according to exemplary embodiments of the present invention stacked on top of each other to form a chip stack package including two thin semiconductor packages, as illustrated in FIG. 9, of four thin semiconductor packages, FIG. 10. Thin semiconductor packages manufactured using the exemplary process depicted in FIGS. 2-7 according to an embodiment of the present invention enables the manufacture of high-density compound semiconductor packages by stacking two or more of the thin packages as shown in FIGS. 9 and 10.

As illustrated in FIGS. 9 and 10, solder balls 42 may be formed on the terminal pad parts 28, rather than on additional stack pads, after which as many thin semiconductor packages as required are aligned and stacked. The stacked thin semiconductor packages may then be heated to allow the solder balls 42 to flow and establish both mechanical and conductive connections between the corresponding terminal pad parts 28 of adjacent thin semiconductor packages to produce a high density of semiconductor package. Moreover, because each of the individual thin semiconductor package incorporated in a stack is tested functionally and/or parametrically before being included in the stacked structure, the overall yield of the high-density compound semiconductor packages may be improved.

As illustrated in FIG. 9, a high-density compound semiconductor package including two thin semiconductor packages of about 200 μm thickness interconnected with solder joints having a height of about 50 μm can be produced with an overall thickness of about 450 μm. Similarly, as illustrated in FIG. 10, a high-density compound semiconductor package including four thin semiconductor packages of about 200 μm thickness interconnected with solder joints having a height of about 50 μm can be produced with a thickness of about 950 μm. As noted above, any number of the thin semiconductor packages can be stacked to form a high-density compound semiconductor package according to the present invention. The final thickness of such a high-density semiconductor package $T_{HDP}$ may be approximated by the equation $T_{HDP}=(n)T_{TP}+(n-1)T_{SJ}$ wherein n is the number of thin semiconductor packages included in the stacked package, $T_{TP}$ is the average thickness of the thin semiconductor packages and $T_{SJ}$ is the average height of the solder joints formed by reflowing the solder balls or the height of another conductive connector arranged between adjacent packages. For example, as an alternative to solder balls, 42, the mechanical and conducting attachments between adjacent thin semiconductor packages may include the use of solder pastes, insulating adhesives and/or conductive adhesives, either separately or in combination with solder balls.

Thin semiconductor packages manufactured according to the exemplary embodiments of the present invention are less susceptible to lead deformation as a result of using an outer portion of the lead frame 20 to form the terminal pad parts 28. Similarly, the terminal pad parts 28 forming the outer leads on thin semiconductor packages manufactured according to the exemplary embodiments of the present invention may be more easily positioned in a substantially planar configuration.

According to the present invention, high-density compound semiconductor packages can be easily manufactured by forming solder balls 42 on the terminal pad parts 28, instead of on additional stack pads, and stacking thin semiconductor packages that have previously passed a performance test. Because the individual thin semiconductor packages stacked in a high-density compound semiconductor package are tested before being stacked, the manufacturing yield of the resulting high-density compound semiconductor packages may also be increased. Further, because each of the thin semiconductor packages includes a single semiconductor chip, stacked chip packages produced according to the exemplary embodiments of the present invention will tend to reduce packaging errors and damage compared to the conventional practice of stacking a plurality of chips on a single lead frame.

Although this invention has been described with reference to exemplary embodiments, it should be understood that the present invention is not so limited and that those of ordinary skill in the art will recognize that various modifications, particularly with respect to the composition and relative thickness of the various layers may be made without departing from the spirit and the scope of the invention as defined by the following claims.

What is claimed is:

1. A method of manufacturing a semiconductor device package comprising:
preparing a lead frame blank from a conductive material, the lead frame blank having a substantially uniform blank thickness $T_B$;
removing a portion of the conductive material from a mounting region to form a recess of substantially uniform depth $T_{RO}$, a substantially planar thinned region having thickness $T_P$ and a terminal region having a thickness $T_T$, wherein $T_B$ is substantially equal to $T_{RO}+T_P$ and $T_T$ is substantially equal to $T_B$;
repositioning a central portion of the thinned region within the recess to form a substantially planar paddle region having a upper surface and a lower surface, such that an overall thickness of the lead frame is substantially equal to $T_B$ and to form a second recess having a depth $T_{RU}$ between the upper surface of the paddle region and an upper surface of the terminal region and a third recess having a depth $T_{RL}$ between the lower surface of the paddle region and a lower surface of the terminal region, wherein $T_{RU}>T_{RL}$;
removing a central region of the paddle region;
forming leads
preparing a semiconductor chip having an active surface and a backside surface, a plurality of bonding pads being arrayed on the active surface;
mounting a portion of the active surface to the paddle region with the bonding pads exposed, which includes forming an adhesive region on an upper surface of the paddle region;
removing a central region of the paddle region, and mounting the active surface of the semiconductor chip on the adhesive region;

providing bonding wires between the bonding pads and corresponding leads to establish a plurality of electrical connections; and encapsulating the semiconductor chip, the bonding wires and a portion of the lead frame with a polymeric material, the polymeric material having a maximum thickness approximately equal to $T_B$ and exposing upper and lower surfaces of the terminal region to form the semiconductor device package.

2. A method of manufacturing a lead frame according to claim 1, wherein:

a ratio of $T_{RU}:T_{RL}$ is between about 2:1 and about 5:1.

3. A method of manufacturing a lead frame according to claim 1, wherein:

the paddle region is connected to the terminal region by an intermediate region having a thickness $T_I$ that is approximately equal to $T_P$ and wherein a portion of the intermediate region is inclined relative to both a first plane defined by the upper surface of the paddle region and a second plane defined by an upper surface of the terminal region.

4. A method of manufacturing a lead frame according to claim 3, wherein:

a portion of the intermediate region adjacent the terminal region has an upper surface that is substantially coplanar with the upper surface of the terminal region.

5. A method of manufacturing a lead frame according to claim 3, wherein:

forming leads includes forming an etch mask pattern and removing portions of the paddle region, the intermediate region and the terminal region to form a plurality of electrically isolated leads.

6. A method of manufacturing a lead frame according to claim 3, wherein:

forming leads includes forming an etch mask pattern and removing portions of the thinned region and the terminal region before forming the paddle region.

7. A method of manufacturing a lead frame according to claim 1, wherein:

the paddle region is connected to the terminal region by an intermediate region having a thickness $T_I$ less than $T_P$ and wherein a portion of the intermediate region is inclined relative to both a first plane defined by the upper surface of the paddle region and a second plane defined by an upper surface of the terminal region.

8. A method of manufacturing a lead frame according to claim 7, wherein:

$T_I$ is no less than about 75% of $T_P$.

9. A method of manufacturing a lead frame according to claim 7, wherein:

a portion of the intermediate region adjacent the terminal region has an upper surface that is substantially coplanar with the upper surface of the terminal region.

10. A method of manufacturing a semiconductor device package according to claim 1, wherein:

the polymeric material has an upper surface that is in a substantially planar orientation with the upper surface of the terminal region; and a lower surface that is in a substantially planar orientation with the lower surface of the terminal region.

11. A method of manufacturing a stacked semiconductor device package comprising:

preparing first and second semiconductor device package according to claim 10;

providing a conductive connector on the upper surface of the terminal region of the first semiconductor device package;

stacking the second semiconductor package on the first semiconductor package whereby the conductive connector provides electrical contact between the terminal region of the first semiconductor device package and a corresponding terminal region of the second semiconductor device; and encapsulating the stacked first and second semiconductor device packages with a second polymeric material, whereby at least the lower surface of the terminal region of the first semiconductor device package is exposed.

12. A method of manufacturing a stacked semiconductor device package according to claim 11, wherein:

the conductive connector is selected from a group consisting of a solder paste, solder balls and a conductive polymeric composition.

13. A method of manufacturing a stacked semiconductor device package according to claim 11, further comprising:

providing an insulating adhesive layer between the upper surface of the polymeric material of the first semiconductor device package and the lower surface of the polymeric material of the second semiconductor device package, the adhesive layer acting to maintain the relative orientation of the semiconductor device packages.

14. A method of manufacturing a stacked semiconductor device package according to claim 11, wherein:

the second polymeric material has a lower surface that is in a substantially planar configuration with the lower surface of the terminal region of the first semiconductor device package.

15. A method of manufacturing a stacked semiconductor device package according to claim 1, wherein:

removing the portion of the conductive material from the mounting region to form the recess of substantially uniform depth includes forming a photoresist pattern that exposes the mounting region of the lead frame blank;

etching the mounting region of the lead frame blank to a predetermined depth using the photoresist as a etching mask; and removing the photoresist pattern.

* * * * *